(12) United States Patent
Itasaka et al.

(10) Patent No.: US 12,401,341 B2
(45) Date of Patent: Aug. 26, 2025

(54) INTEGRATED CIRCUIT APPARATUS AND OSCILLATOR INCLUDING A PROTECTIVE WIRING PROVIDED BETWEEN A PAD AND A CIRCUIT

(71) Applicant: Seiko Epson Corporation, Tokyo (JP)

(72) Inventors: Yosuke Itasaka, Minowa (JP); Naoki Ii, Suwa (JP)

(73) Assignee: SEIKO EPSON CORPORATION (JP)

(*) Notice: Subject to any disclaimer, the term of this patent is extended or adjusted under 35 U.S.C. 154(b) by 518 days.

(21) Appl. No.: 17/732,626

(22) Filed: Apr. 29, 2022

(65) Prior Publication Data

US 2022/0352872 A1 Nov. 3, 2022

(30) Foreign Application Priority Data

Apr. 30, 2021 (JP) .................................. 2021-077191

(51) Int. Cl.
| | |
|---|---|
| *H03H 9/05* | (2006.01) |
| *H01L 23/00* | (2006.01) |
| *H03B 5/36* | (2006.01) |
| *H03H 9/10* | (2006.01) |
| *H03H 9/19* | (2006.01) |

(52) U.S. Cl.
CPC ......... *H03H 9/0557* (2013.01); *H01L 23/562* (2013.01); *H03B 5/36* (2013.01); *H03H 9/1021* (2013.01); *H03H 9/19* (2013.01)

(58) Field of Classification Search
CPC ...... H03H 9/0557; H03H 9/1021; H03H 9/19; H01L 27/0288; H01L 23/562; H03B 5/36; H10D 89/811; H10D 89/911
See application file for complete search history.

(56) References Cited

U.S. PATENT DOCUMENTS

| | | | | |
|---|---|---|---|---|
| 6,517,195 B1* | 2/2003 | Koeda | ................. | B41J 2/04541 347/68 |
| 8,076,748 B2* | 12/2011 | Saiki | ................. | H01L 27/0288 257/491 |
| 2004/0016980 A1* | 1/2004 | Nakadaira | ............... | H01L 24/03 257/411 |
| 2005/0161835 A1* | 7/2005 | Maeda | .................... | H01L 24/05 257/786 |
| 2008/0210935 A1* | 9/2008 | Ebara | ..................... | H01L 24/03 257/E23.01 |
| 2018/0145629 A1* | 5/2018 | Yamamoto | .............. | H03L 1/028 |
| 2018/0152141 A1* | 5/2018 | Koyama | .............. | H01Q 1/2283 |
| 2019/0212145 A1* | 7/2019 | Kiya | .................. | G01C 19/5628 |

FOREIGN PATENT DOCUMENTS

JP 2005-236277 A 9/2005

* cited by examiner

*Primary Examiner* — Khiem D Nguyen
(74) *Attorney, Agent, or Firm* — Harness, Dickey & Pierce, P.L.C.

(57) ABSTRACT

An integrated circuit apparatus includes a pad via which an AC signal is inputted or outputted, a circuit that overlaps with the pad in the plan view, protective wiring provided between the pad and the circuit, and a resistor having one end electrically coupled to the protective wiring and another end electrically coupled to an electric charge discharging path.

17 Claims, 12 Drawing Sheets

INTEGRATED CIRCUIT APPARATUS AND OSCILLATOR INCLUDING A PROTECTIVE WIRING PROVIDED BETWEEN A PAD AND A CIRCUIT

The present application is based on, and claims priority from JP Application Serial Number 2021-077191, filed Apr. 30, 2021, the disclosure of which is hereby incorporated by reference herein in its entirety.

BACKGROUND

1. Technical Field

The present disclosure relates to an integrated circuit apparatus, an oscillator, and the like.

2. Related Art

In an integrated circuit apparatus, circuits are disposed below pads in some cases to reduce the area of the integrated circuit apparatus. For example, JP-A-2005-236277 discloses an integrated circuit apparatus so configured that circuits are disposed under pads and a reinforcing mesh pattern is provided below the pads.

In JP-A-2005-236277, however, influences of the provided reinforcing mesh pattern on the characteristics of the integrated circuit apparatus are not at all taken into consideration.

SUMMARY

An aspect of the present disclosure relates to an integrated circuit apparatus including a pad via which an AC signal is inputted or outputted, a circuit that overlaps with the pad in a plan view, protective wiring provided between the pad and the circuit, and a resistor having one end electrically coupled to the protective wiring and another end electrically coupled to an electric charge discharging path.

Another aspect of the present disclosure relates to an oscillator including the integrated circuit apparatus described above and the resonator.

DESCRIPTION OF EXEMPLARY EMBODIMENTS

An embodiment of the present disclosure will be described below. It is not intended that the present embodiment described below unduly limits the contents described in the claims. Furthermore, all configurations described in the present embodiment are not necessarily essential configuration requirements of the present disclosure.

1. Protective Wiring

Figure 1:
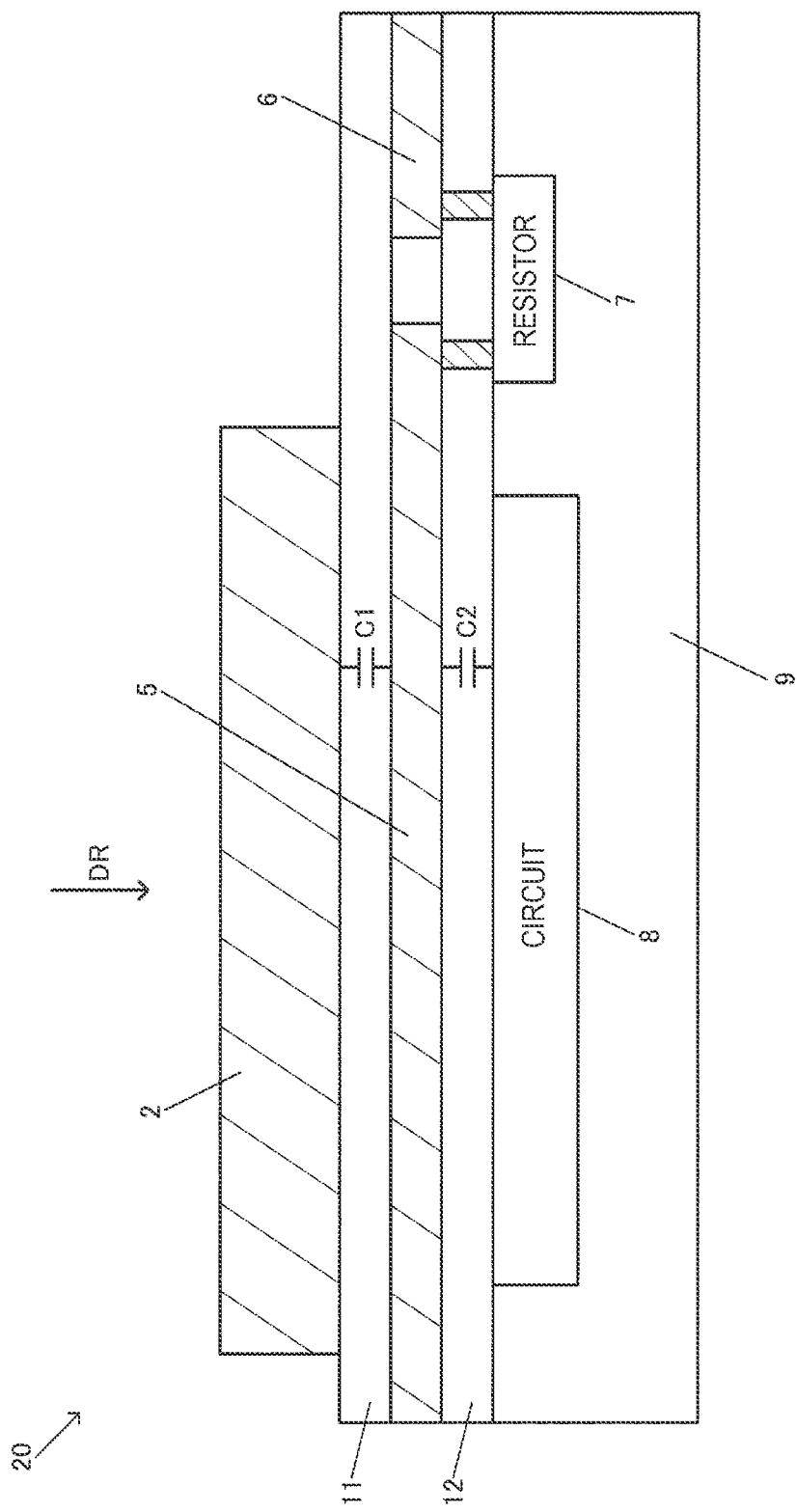
FIG. 1 is a cross-sectional view of a pad region showing an example of the configuration of an integrated circuit apparatus according to an embodiment of the present disclosure.

FIG. 1 is a cross-sectional view of a pad region showing an example of the configuration of an integrated circuit apparatus 20 according to the present embodiment. The integrated circuit apparatus 20 according to the present embodiment includes a pad 2, a circuit 8, a protective wiring 5, and a resistor 7, as shown in FIG. 1.

The pad 2 is a terminal via which a signal is inputted or outputted. Specifically, the pad 2 is, for example, a pad via which an AC signal is inputted or outputted. The AC signal is a signal carrying a voltage or a current that varies, for example, periodically as the time elapses. The AC signal may be a sinusoidal AC signal or a non-sinusoidal AC signal, such as a square wave AC signal. Examples of the AC signal include an oscillation signal and a clock signal. The pad 2 may be a pad via which such an AC signal is inputted, a pad via which such an AC signal is outputted, or a pad via which such an AC signal is inputted or outputted. The pad 2 is formed, for example, of a metal layer. In the region of the pad, for example, the metal layer is exposed via a passivation film, which is an insulation layer, and the exposed metal layer forms the pad 2 of the integrated circuit apparatus 20.

The circuit 8 overlaps with the pad 2 in a plan view. For example, the circuit 8 is provided below the pad 2 so as to overlap therewith in the plan view. The circuit 8 is, for example, a functional circuit having a predetermined function and is also called a circuit block. The circuit 8 is formed, for example, of a plurality of circuit elements. The circuit elements are active elements, such as transistors, and passive elements, such as resistors and capacitors. For example, a certain number of circuit elements necessary for formation of the circuit 8, such as transistors, resistors, and capacitors, are disposed below the pad 2. The circuit 8 includes an AC signal generation circuit, such as an oscillation circuit that generates an oscillation signal and an output buffer circuit that outputs a clock signal, an electrostatic protection circuit, a voltage stabilizing capacitor, a filter circuit, or a voltage generation circuit, such as a reference voltage generation circuit.

The plan view is a plan view seen in a direction DR in FIG. 1, for example, a plan view seen in the direction perpendicular to a semiconductor substrate 9, which forms the integrated circuit apparatus 20. In FIG. 1, the substrate 9 is, for example, a P-type substrate and is set so as to have, for example, a ground potential. In the following description, the ground will be referred to as GND as appropriate. The circuit 8 is disposed so as to overlap with the pad 2 in the plan view. For example, when the direction DR toward the substrate 9 is the downward direction, the circuit 8 is disposed below the pad 2. The pad 2 and the circuit 8 are electrically coupled to each other via, for example, wiring lines or vias. Arranging the circuit 8 so as to overlap with the pad 2 in the plan view as described above allows reduction in the layout area of the integrated circuit apparatus 20.

Figure 2:
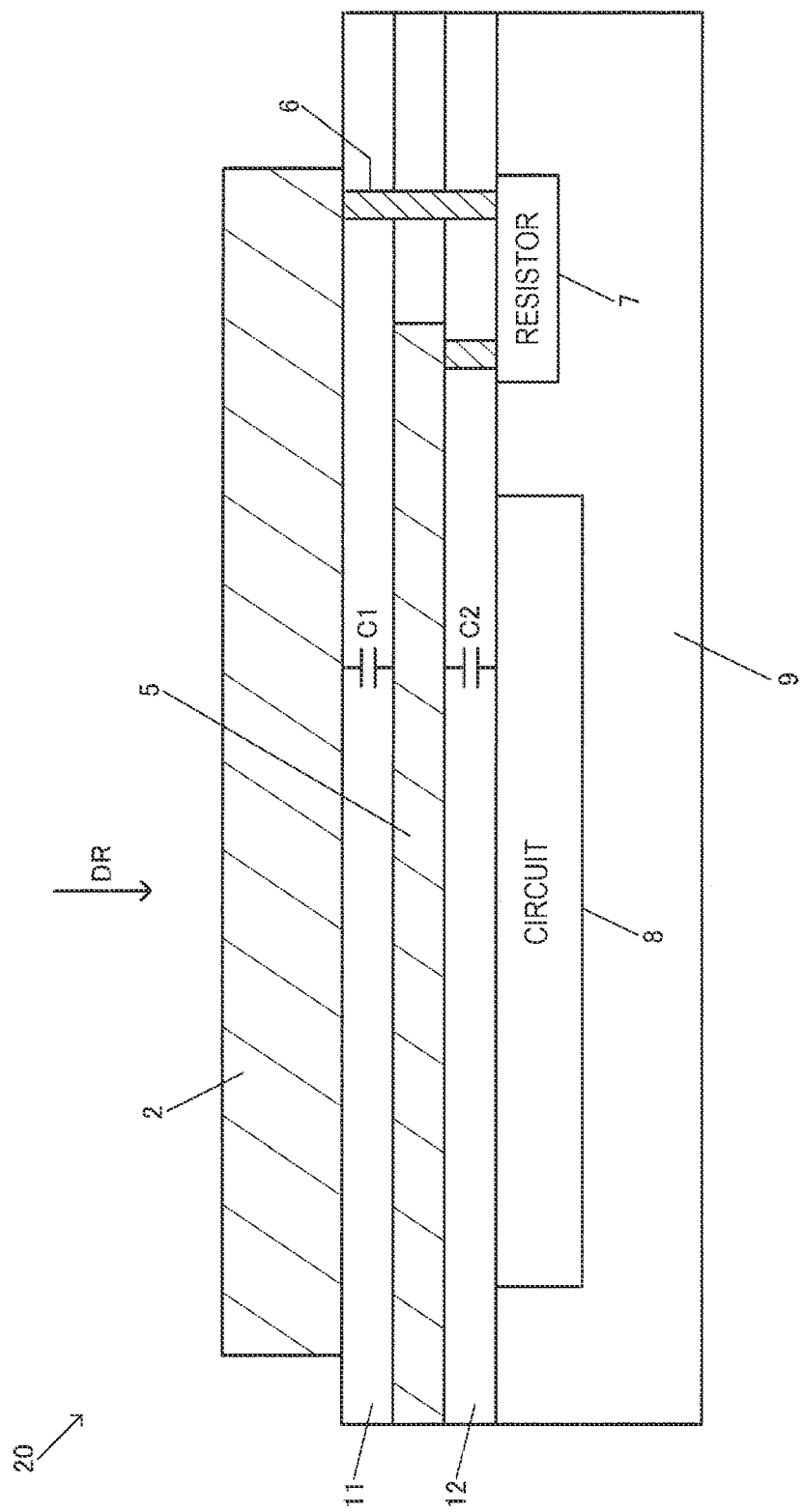
FIG. 2 is a cross-sectional view of the pad region showing another example of the configuration of the integrated circuit apparatus according to the embodiment.
Figure 11:
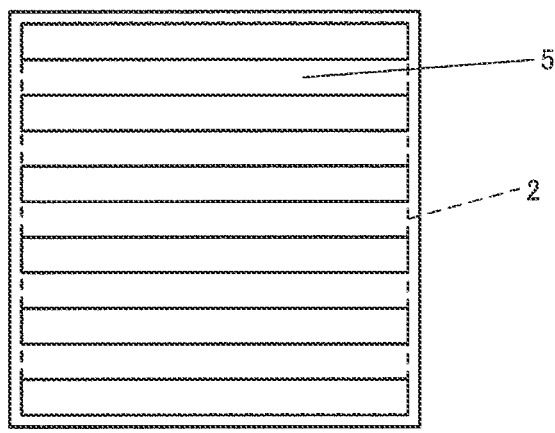
FIG. 11 shows an example of the wiring pattern of the protective wiring.

The protective wiring 5 is provided between the pad 2 and the circuit 8. The protective wiring 5 is wiring provided to protect the circuit 8 provided below the pad 2 and is, for example, electrically conductive wiring. For example, the integrated circuit apparatus 20 has a multilayer wiring structure formed of a plurality of metal layers including inter-metal-layer insulation layers 11 and 12 and other layers, and the protective wiring 5 is formed of one of the plurality of metal layers. In FIG. 2, for example, the pad 2 is formed of the uppermost metal layer, and the protective wiring 5 is formed of a metal layer below the metal layer that forms the pad 2. The metal layers are each, for example, a layer made of aluminum or an aluminum alloy. The protective wiring 5 may instead be formed of two or more metal layers. The insulation layer 11 is provided between the metal layer that forms the pad 2 and the metal layer that forms the protective wiring 5. The insulation layer 12 is further provided between the metal layer that forms the protective wiring 5 and the circuit 8. FIG. 11 diagrammatically shows a cross section of the pad region of the integrated circuit apparatus 20, and two or more metal layers are actually provided between the pad 2 and the circuit 8. For example, when the integrated circuit apparatus 20 includes multilayered structure wiring including a first metal layer to a fifth metal layer, the pad 2 is formed of the fifth metal layer, and the protective wiring 5 is formed of the fourth metal layer or the third metal layer below the fifth metal layer. The wiring among the circuit elements of the circuit 8 is formed of the first metal layer and the second metal layer below the third metal layer.

Figure 9:
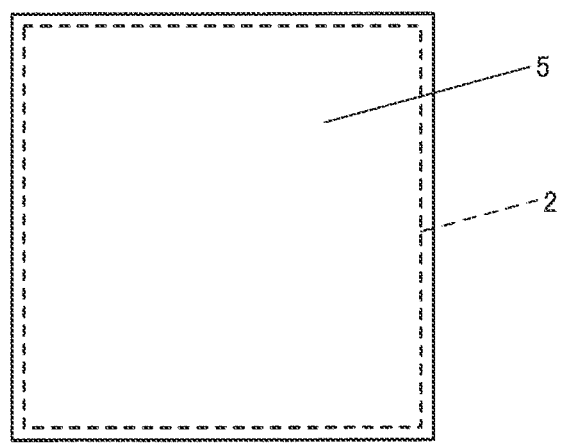
FIG. 9 shows an example of the wiring pattern of protective wiring.
Figure 10:
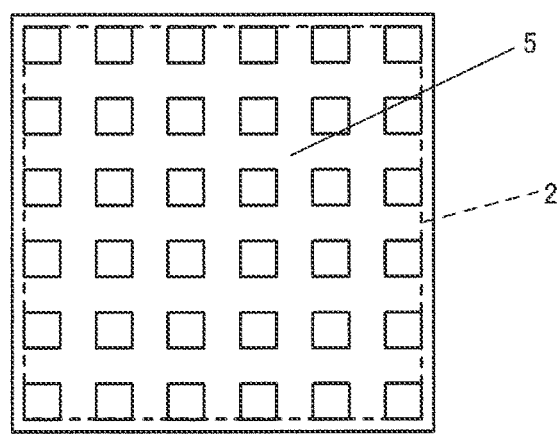
FIG. 10 shows an example of the wiring pattern of the protective wiring.
Figure 12:
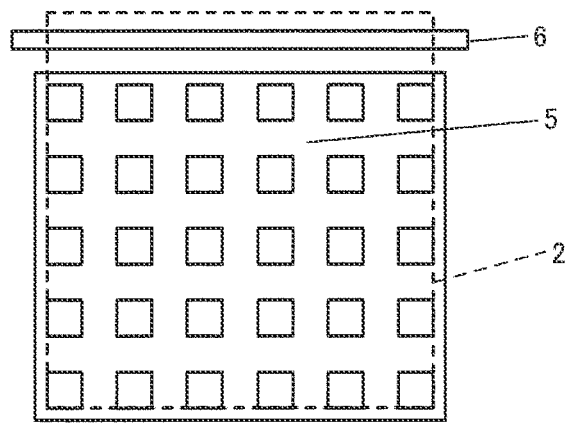
FIG. 12 shows an example of the wiring pattern of the protective wiring.

The protective wiring 5 is disposed so as to overlap, for example, with the entire region of the pad 2 in the plan view, as shown in FIGS. 9 to 11, which will be described later. In this case, the protective wiring 5 does not need to be wired without gaps over the entire region of the pad 2 in the plan view, and may be wired in a lattice pattern as shown in FIG. 10 or in a fence pattern as shown in FIG. 11. Furthermore, the protective wiring 5 is not necessarily disposed over the entire region of the pad 2 in the plan view, and may be disposed so as to overlap, for example, with at least part of the pad 2 in the plan view, as shown in FIG. 12. The protective wiring 5 only needs to be disposed so as to overlap with at least the entire region of the circuit 8 below the pad 2 in the plan view.

The resistor 7 has one end electrically coupled to the protective wiring 5 and another end electrically coupled to an electric charge discharging path 6. For example, one end of the resistor 7 is coupled to the protective wiring 5 via a via, and the other end of the resistor 7 is coupled to the electric charge discharging path 6 via a via. The vias are each, for example, a contact that couples metal layers to each other. The resistor 7 may be realized, for example, by a diffusive resistor, or may be realized by a polysilicon resistor or a metal layer resistor. For example, the resistor 7 is formed of an N-type diffusion layer formed in the P-type substrate 9 in FIG. 1. The electric charge discharging path 6 is a path along which electric charge in the protective wiring 5 is discharged. The electric charge charged in the protective wiring 5 is discharged via the resistor 7 and the electric charge discharging path 6. The electric charge discharging path 6 is, for example, ground wiring or power source wiring, as will be described later. The electric charge discharging path 6 may instead be a path coupled to the pad 2 or output wiring from the voltage generation circuit, such as a reference voltage generation circuit.

As described above, in the integrated circuit apparatus 20 according to the present embodiment, the circuit 8 is provided so as to overlap with the pad 2 in the plan view. The region of the pad 2 can therefore be effectively used to dispose the circuit 8, whereby the area of the integrated circuit apparatus 20 can be reduced. That is, disposing the circuit 8 in the region of the pad 2 allows reduction in the area of the integrated circuit apparatus 20 by the area of the circuit 8 as compared with a case where the circuit 8 is disposed outside the region of the pad 2. In the present embodiment, the protective wiring 5 is provided between the pad 2 and the circuit 8. Providing the protective wiring 5 configured as described above allows protection of the circuit 8 provided below the pad 2. For example, even when a force acts on the pad 2 at the time of mounting or inspection of the integrated circuit apparatus 20, the configuration in which the protective wiring 5 is interposed between the pad 2 and the circuit 8 can prevent the force from acting on the circuit 8. For example, when a bump or a bonding wire is coupled to the pad 2 at the time of mounting of the integrated circuit apparatus 20, or when a probe comes into contact with the pad 2 at the time of inspection of the integrated circuit apparatus 20, the force acting on the pad 2 may be transmitted to the circuit 8, and the circuit 8 may breaks or becomes defective. In this regard, in the present embodiment, in which the protective wiring 5 is provided between the pad 2 and the circuit 8, the protective wiring 5 can absorb the force to prevent the problems described above from occurring.

On the other hand, it has been found that when the protective wiring 5 is provided between the pad 2 and the circuit 8 as described above, the protective wiring 5 causes a problem of an adverse effect on the circuit characteristics of the integrated circuit apparatus 20. For example, in the related-art technology in JP-A-2005-236277 described above, no consideration is given at all to deterioration of the circuit characteristics caused by the protective wiring 5.

In this case, there is, for example, a conceivable first approach in which the protective wiring 5 is directly coupled to the ground or a power source. That is, the first approach is an approach in which the ground wiring or the power source wiring is used as the protective wiring 5. The first approach, however, has a problem of an increase in capacitance that is the parasitic capacitance of the pad 2 and hence deterioration of the circuit characteristics of the integrated circuit apparatus 20, as will be described later with reference to FIG. 7. For example, when the protective wiring 5 is not provided below the pad 2, the capacitance of the pad 2 is the capacitance between the pad 2 and the substrate 9, and the large distance between the pad 2 and the substrate 9 reduces the capacitance of the pad 2. When the protective wiring 5 coupled to the ground or the power source is provided below the pad 2, however, the distance between the pad 2 and the protective wiring 5 is shorter than the distance between the pad 2 and the substrate 9, resulting in an increase in the capacitance of the pad 2. As described above, for example, an increase in the capacitance of the pad 2, via which the AC signal is inputted or outputted causes a problem of an adverse effect on the circuit characteristics of the integrated circuit apparatus 20 due, for example, to deterioration of the signal characteristics of the AC signal.

There is instead, for example, a conceivable second approach in which the protective wiring 5 is not coupled to anywhere but remains open. The second approach, however, provides no place to which the electric charge charged in the open protective wiring 5 is released, resulting in ESD destruction, unintended characteristic fluctuations of the integrated circuit apparatus 20, and other problems due to the electric charge.

In this regard, in the present embodiment, the protective wiring 5 provided between the pad 2 and the circuit 8 is electrically coupled to one end of the resistor 7, and the other end of the resistor 7 is electrically coupled to the electric charge discharging path 6. The capacitance of the pad 2 can therefore be reduced as compared with the aforementioned first approach, in which the protective wiring 5 is directly coupled to the ground or the power source, whereby the deterioration of the circuit characteristics of the integrated circuit apparatus 20 due to the capacitance can be suppressed. Furthermore, the electric charge charged in the protective wiring 5 is discharged via the resistor 7 and the electric charge discharging path 6. The ESD destruction, the characteristic fluctuations, and other situations that occur in the aforementioned second approach, in which the protective wiring 5 remains open, can be avoided. As described above, the present embodiment allows the integrated circuit apparatus 20 to be so provided that the protective wiring 5 protects the circuit 8 below the pad 2 and an increase in the parasitic capacitance, the deterioration of the characteristics of the integrated circuit apparatus 20, and other disadvantages caused by the protective wiring 5 are suppressed.

FIG. 2 is a cross-sectional view of the pad region showing another example of the configuration of the integrated circuit apparatus 20 according to the present embodiment. FIG. 2 differs from FIG. 1 in that the resistor 7 has one end electrically coupled to the protective wiring 5 and another end electrically coupled to the pad 2 in FIG. 2. For example, one end of the resistor 7 is coupled to the protective wiring 5 via a via, and the other end of the resistor 7 is coupled to the pad 2 via a via corresponding to the electric charge discharging path 6. That is, in FIG. 2, the electric charge discharging path 6 is a path coupled to the pad 2. For example, a device or wiring electrically coupled to the pad 2 serves as an electric charge discharging path. Electrically coupling the protective wiring 5 to the pad 2 via the resistor 7 therefore allows the electric charge charged in the protective wiring 5 to be discharged out of the integrated circuit apparatus 20.

Figure 3:
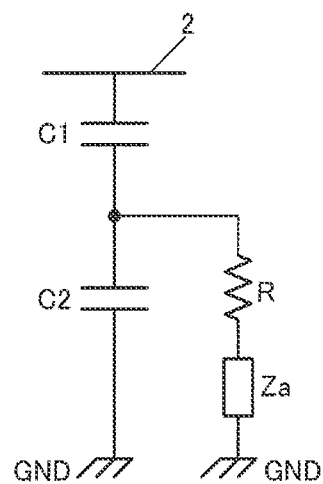
FIG. 3 is an equivalent circuit diagram showing the configuration in which capacitance and resistance are coupled to each other.

FIG. 3 is an equivalent circuit diagram showing the configuration in which capacitance and resistance in the integrated circuit apparatus 20 having the configuration shown in FIG. 1 are coupled to each other. C1 corresponds to the capacitance between the pad 2 and the protective wiring 5, and C2 corresponds to the capacitance between the protective wiring 5 and the substrate 9 in FIG. 1. R is the resistance of the resistor 7, and Za is the impedance with respect to the ground to which the resistor 7 is coupled and is also the impedance of the electric charge discharging path 6. As described above, capacitance C, which is the combined capacitance of the pad 2 in the configuration shown in FIG. 1, is expressed by C1, C2, R, and Za in the coupling configuration shown in FIG. 3.

Figure 4:
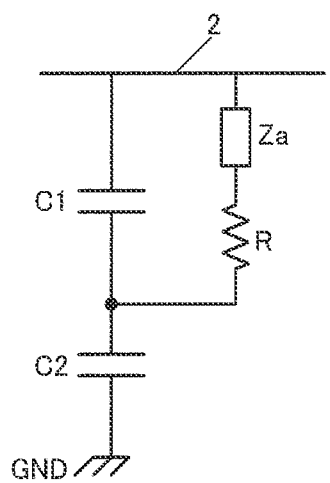
FIG. 4 is an equivalent circuit diagram showing the configuration in which capacitance and resistance are coupled to each other.
Figure 5:
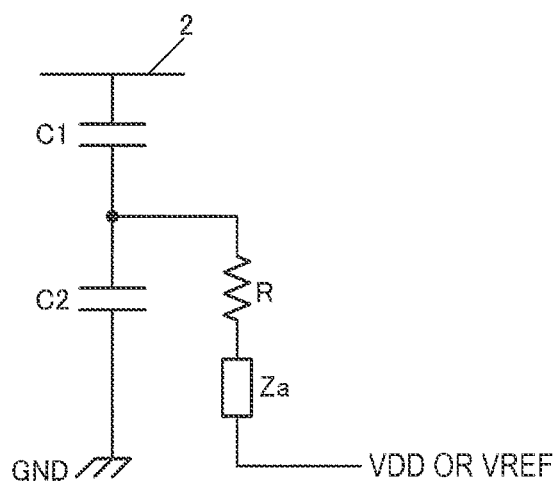
FIG. 5 is an equivalent circuit diagram showing the configuration in which capacitance and resistance are coupled to each other.

On the other hand, when the electric charge discharging path 6 is a path coupled to the pad 2 as shown in FIG. 2, the capacitance C of the pad 2 is expressed by C1, C2, R, and Za in the coupling configuration shown in FIG. 4. When the electric charge discharging path 6 in FIG. 1 is ground wiring, the destination to which the resistor 7 expressed by R is coupled is the ground, as shown in FIG. 3, whereas when the electric charge discharging path 6 is power source wiring, the destination to which the resistor 7 is coupled is VDD, which is the power source, as shown in FIG. 5. In the present embodiment, the electric charge discharging path 6 may instead be the output wiring from the voltage generation circuit. In this case, the destination to which the resistor 7 expressed by R is coupled is the wiring along which VREF, which is the voltage generated by the voltage generator circuit, is outputted as shown in FIG. 5. For example, the voltage generation circuit is a reference voltage generation circuit, and the wiring along which the reference voltage VREF generated by the reference voltage generation circuit is outputted is, for example, the destination to which the resistor 7 is coupled.

As described above, in the present embodiment, the electric charge discharging path 6 is, for example, ground wiring or source supply wiring, as shown in FIGS. 3 and 5. The configuration described above allows the electric charge in the protective wiring 5 to be discharged to the electric charge discharging path 6 formed of low-impedance ground wiring or power source wiring and therefore prevents occurrence of the problems caused, for example, by the electric charge charged in the protective wiring 5. Furthermore, coupling one end of the resistor 7 to the low-impedance electric charge discharging path 6 prevents unnecessary electric charge from flowing into the circuits of the integrated circuit apparatus 20.

In the present embodiment, the electric charge discharging path 6 may be a path coupled to the pad 2, as shown in FIGS. 2 and 4. For example, the pad 2 is electrically coupled, for example, to a device, such as a resonator external to the integrated circuit apparatus 20, or to wiring in a circuit board, and such an external device, wiring, and other components are each suitable as the destination to which electric charge is discharged. The electric charge in the protective wiring 5 can therefore be discharged to a device, wiring, or any other component electrically coupled to the pad 2, whereby occurrence of the problems caused, for example, by the electric charge charged in the protective wiring 5 can be avoided.

In the present embodiment, the electric charge discharging path 6 may be the output wiring from the voltage generation circuit, as shown in FIG. 5. For example, the voltage generation circuit, such as a reference voltage generation circuit, uses an amplifier circuit or any other component to output a voltage, such as a reference voltage, to the output wiring, and the amplifier circuit has low input impedance and is therefore a suitable path to which electric charge is discharged. The electric charge in the protective wiring 5 can therefore be discharged to low-impedance output wiring, whereby occurrence of the problems caused, for example, by the electric charge charged in the protective wiring 5.

Figure 6:
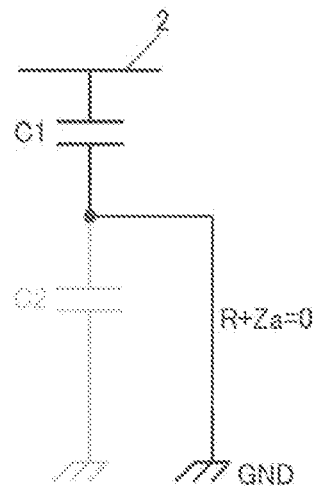
FIG. 6 is an equivalent circuit diagram showing the configuration in which capacitance and resistance are coupled to each other.

The capacitance C, which is the parasitic capacitance of the pad 2, will next be described more specifically with reference to FIGS. 6 to 8. Let C1 be the capacitance between the pad 2 and the protective wiring 5, and C2 be the capacitance between the protective wiring 5 and the substrate 9. FIG. 6 shows a case where the protective wiring 5 is directly coupled to the ground. In this case, R+Za=0 is satisfied. The capacitance C=Cmax between the pad 2 and the substrate 9 is therefore expressed by Expression (1) below.

$$Cmax = C1 \quad (1)$$

Figure 7:
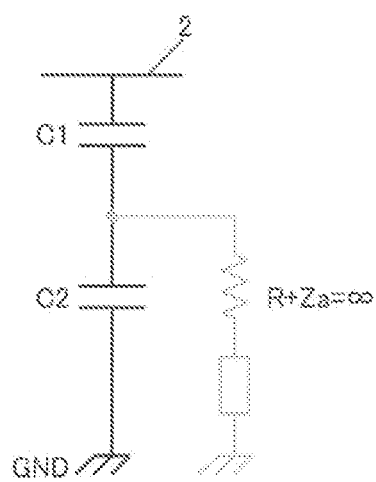
FIG. 7 is an equivalent circuit diagram showing the configuration in which capacitance and resistance are coupled to each other.

FIG. 7 shows the case where the protective wiring 5 remains open. In this case, R+Za=∞ is satisfied. The capacitance C=Cmin between the pad 2 and the substrate 9 is therefore expressed by Expression (2) below.

$$Cmin = \frac{1}{\frac{1}{C1} + \frac{1}{C2}} \quad (2)$$

For example, when C1=C2 is satisfied in Expression (2) shown above, Cmin=(1/2)C1 is satisfied.

Figure 8:
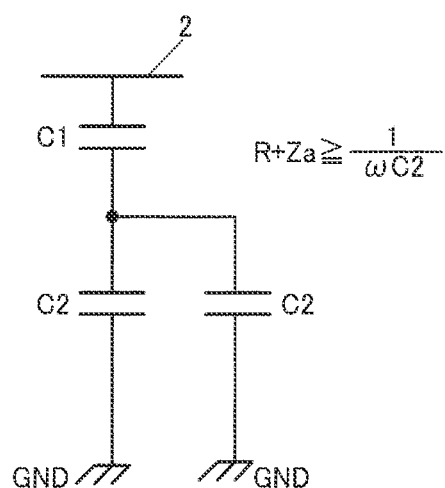
FIG. 8 is an equivalent circuit diagram showing the configuration in which capacitance and resistance are coupled to each other.

FIG. 8 shows a case where R+Za≥1/ωC2 is satisfied. In this case, the capacitance C between the pad 2 and the substrate 9 is expressed by Expression (3) below.

$$C \leq \frac{1}{\frac{1}{C1} + \frac{1}{2C2}} \quad (3)$$

When C1=C2 is satisfied in Expression (3) shown above, Expression (4) shown below is satisfied.

$$C \leq \frac{1}{\frac{1}{C1} + \frac{1}{2C1}} = \frac{2}{3}C1 \quad (4)$$

From Expressions (2) and (3), coupling the resistor 7 to one end of the protective wiring 5 allows the following expression to be satisfied: 1/{(1/C1)+(1/C2)}≤C≤1/{(1/C1)+(1/2C2)} in the present embodiment. When C1=C2 is satisfied, (1/2)C1≤C≤(2/3) C1 is satisfied.

In the present embodiment, since the pad 2 is a pad via which an AC signal is inputted or outputted, the capacitance C between the pad 2 and the substrate 9 is desirably as small as possible. To this end, R, which is the resistance of the resistor 7, is so set that R+Za≥1/ωC2 is satisfied, as shown in FIG. 8. The following expression is therefore satisfied: C≤1/{(1/C1)+(1/2C2)}, as shown by Expression (3) above. On the other hand, the minimum of the capacitance C is Cmin=1/{(1/C1)+(1/C2)}, as shown by Expression (2) above. The following expression is therefore satisfied: 1/{(1/C1)+(1/C2)}≤C≤1/{(1/C1)+(1/2C2)}. That is, R, which is the resistance of the resistor 7, is set at a value that satisfies the expression shown above. The configuration described above allows the capacitance C of the pad 2 to be reduced to suppress deterioration of the signal characteristics of the AC signal and other disadvantages caused by the capacitance C, whereby deterioration of the circuit characteristics of the integrated circuit apparatus 20 can be suppressed.

FIGS. 9, 10, 11, and 12 show examples of the wiring pattern of the protective wiring 5. In FIG. 9, the protective wiring 5 is disposed so as to overlap with the entire surface of the pad 2 with no gap in the plan view. For example, the protective wiring 5 having a solid wiring pattern is disposed so as to overlap with the pad 2 in the plan view.

In FIG. 10, the protective wiring 5 is lattice-shaped wiring and has a lattice-shaped wiring pattern. The lattice-shaped wiring pattern is formed, for example, of a first wiring group including a plurality of wires wired so as to be separate from each other by a predetermined distance along a first direction, and a second wiring group including a plurality of wires wired so as to be separate from each other by a predetermined distance along a second direction perpendicular to the first direction and intersect with the first wiring group. For example, in the lattice-shaped wiring pattern, a plurality of holes arranged in a matrix are formed in the protective wiring 5 in the plan view.

In FIG. 11, the protective wiring 5 is fence-shaped wiring and has a fence-shaped wiring pattern. The fence-shaped wiring pattern is formed of a wiring group including a plurality of wires wired so as to be separate from each other by a predetermined distance along the first direction. For example, in the fence-shaped wiring pattern, a plurality of rectangular holes arranged along the second direction perpendicular to the first direction in the plan view are formed in the protective wiring 5.

As described above, the protective wiring 5 is the lattice-shaped wiring or the fence-like wiring in FIGS. 10 and 11, respectively. Employing the lattice-shaped wiring or the fence-shaped wiring as the protective wiring 5 as described above causes a plurality of holes to be formed in the protective wiring 5, as shown in FIGS. 10 and 11. The formation of the plurality of holes allows reduction in an area S2 of the protective wiring 5 and in turn reduction in the capacitance C of the pad 2, as will be described later with reference to FIG. 13. The configuration described above allows suppression of deterioration of the signal characteristics of the AC signal and other disadvantages caused by the capacitance C, whereby deterioration of the circuit characteristics of the integrated circuit apparatus 20 can be suppressed.

In FIGS. 9 to 11, the protective wiring 5 is disposed over the entire region of the pad 2 in the plan view, whereas in FIG. 12, the protective wiring 5 is disposed in part of the pad 2 in the plan view. In the region where the pad 2 is disposed, wiring that will form the electric charge discharging path 6 is disposed in the region where the protective wiring 5 is not disposed in the plan view. For example, at least one of the ground wiring and the power source wiring that will form the electric charge discharging path 6 is wired in the region where the protective wiring 5 is not disposed. The configuration described above allows short-path coupling of the protective wiring 5 to the electric charge discharging path 6.

Figure 13:
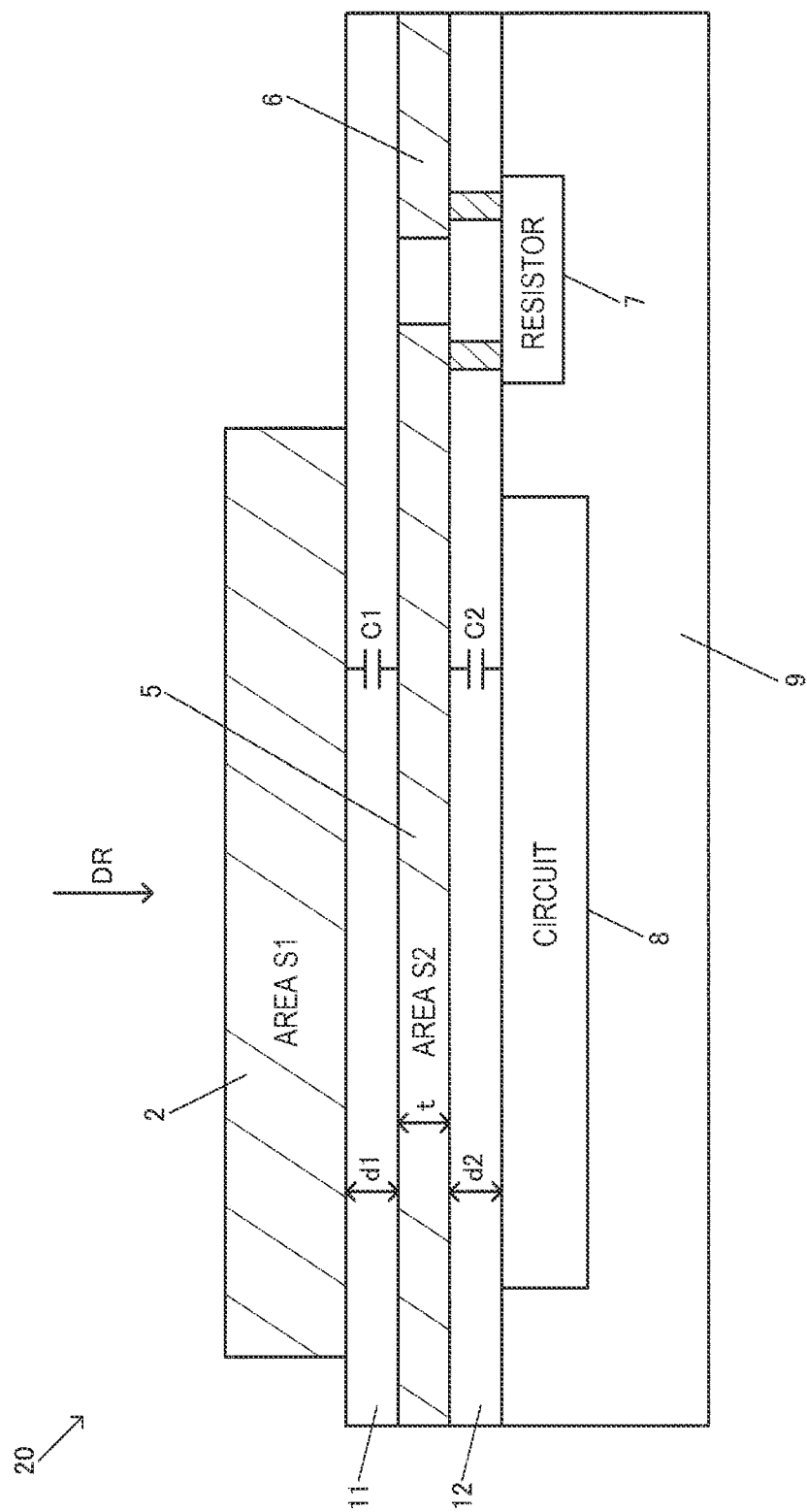
FIG. 13 describes the capacitance of a pad.

FIG. 13 describes the capacitance of the pad 2. Let S1 be the area of the pad 2 and S2 be the area of the protective wiring 5 in the plan view, as shown in FIG. 13. Further, let d1 be the thickness of the insulation layer 11, d2 be the thickness of the insulation layer 12, and t be the thickness of the protective wiring 5. Under the definitions described above, when the protective wiring 5 is not provided, the capacitance C of the pad 2 is expressed by Expression (5) below.

$$C = \varepsilon_0 \varepsilon_r \frac{S1}{d1 + d2} \quad (5)$$

On the other hand, when the protective wiring 5 is provided solidly over the entire surface of the pad 2 in the plan view as shown in FIG. 9, the capacitance C of the pad 2 is expressed by Expression (6) below.

$$C = \frac{1}{\frac{1}{C1} + \frac{1}{C2}} = \frac{1}{\frac{1}{\varepsilon_0 \varepsilon_r \frac{S1}{d1}} + \frac{1}{\varepsilon_0 \varepsilon_r \frac{S1}{d2}}} = \varepsilon_0 \varepsilon_r \frac{S1}{d1 + d2} \quad (6)$$

When the protective wiring 5 is the lattice-shaped wiring or the fence-shaped wiring as shown in FIG. 10 or 11, the capacitance C of the pad 2 is expressed by Expression (7) or (8) below. In Expressions (7) and (8), C3 corresponds to the capacitance between the pad 2 and the substrate 9 in the portion where the protective wiring 5 is not provided.

$$C = \frac{1}{\frac{1}{C1} + \frac{1}{C2}} + C3 = \quad (7)$$

$$\frac{1}{\frac{1}{\varepsilon_0 \varepsilon_r \frac{S2}{d1}} + \frac{1}{\varepsilon_0 \varepsilon_r \frac{S2}{d2}}} + \varepsilon_0 \varepsilon_r \frac{S1 - S2}{d1 + d2 + t} = \varepsilon_0 \varepsilon_r \left( \frac{S2}{d1 + d2} + \frac{S1 - S2}{d1 + d2 + t} \right)$$

$$= \varepsilon_0 \varepsilon_r \left\{ \frac{S1}{d1 + d2 + t} + \left( \frac{1}{d1 + d2} - \frac{1}{d1 + d2 + t} \right) S2 \right\} \quad (8)$$

As shown in Expression (7) above, an increase in the thickness t of the protective wiring 5 can reduce the capacitance C of the pad 2. Furthermore, as shown in Expression (8) above, a decrease in the area S2 of the protective wiring 5 can reduce the capacitance C of the pad 2. The capacitance C of the pad 2 can therefore be reduced by employing the lattice-shaped wiring or the fence-shaped wiring as the protective wiring 5 to reduce the area S2, as shown in FIGS. 10 and 11. The configuration described above allows suppression of deterioration of the signal characteristics of the AC signal and other disadvantages caused by the capacitance C, whereby deterioration of the circuit characteristics of the integrated circuit apparatus 20 can be suppressed.

As described above, the present embodiment, in which the protective wiring 5 has a wiring pattern of the lattice-shaped wiring, the fence-shaped wiring, or any other type of wiring, as shown, for example, in FIGS. 10 and 11, causes the area S2 of the protective wiring 5 in the plan view to be smaller than an area S1 of the pad 2. For example, the area S2 of the protective wiring 5 is made smaller than the area of the region inside the outer edge of the protective wiring 5. The reduction in the area S2 of the protective wiring 5 as described above allows reduction in the capacitance C of the pad 2, as indicated by Expression (8) shown above. The configuration described above allows suppression of deterioration of the signal characteristics of the AC signal and other disadvantages caused by the capacitance C, whereby deterioration of the circuit characteristics of the integrated circuit apparatus 20 can be suppressed.

Figure 14:
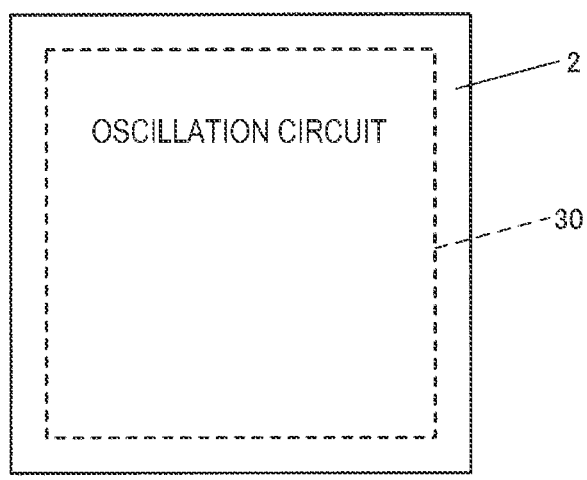
FIG. 14 shows an example of a circuit provided below the pad.

Furthermore, in the present embodiment, the integrated circuit apparatus 20 is electrically coupled to a resonator 10, as will be described later with reference to FIGS. 17 and 19. The circuit 8, which overlaps with the pad 2 in the plan view, as shown in FIG. 14, is an oscillation circuit 30, which causes the resonator 10 to oscillate. That is, the oscillation circuit 30, which generates an oscillation signal, is disposed so as to overlap with the pad 2 in the plan view. In this case, the pad 2 serves as a pad via which the oscillation signal, which is an AC signal, is inputted or outputted. When the oscillation circuit 30 is disposed so as to overlap with the pad 2 in the plan view as described above, the region of the pad 2 can be effectively used to dispose part or entirety of the oscillation circuit 30, whereby the area of the integrated circuit apparatus 20 can be reduced. Furthermore, in the present embodiment, in which the protective wiring 5 is provided between the pad 2 and the oscillation circuit 30, even when a force acts on the pad 2, for example, during mounting or inspection of the integrated circuit apparatus 20, the protective wiring 5 absorbs the force to suppress transmission of the force to the oscillation circuit 30. The configuration described above prevents the oscillation circuit 30 from being broken or defective due to the force. The oscillation circuit 30 does not need to entirely overlap with the pad 2 in the plan view. For example, only part or entirety of a drive circuit or a variable capacitance circuit that forms the oscillation circuit 30 may be disposed so as to overlap with the pad 2 in the plan view.

Figure 17:
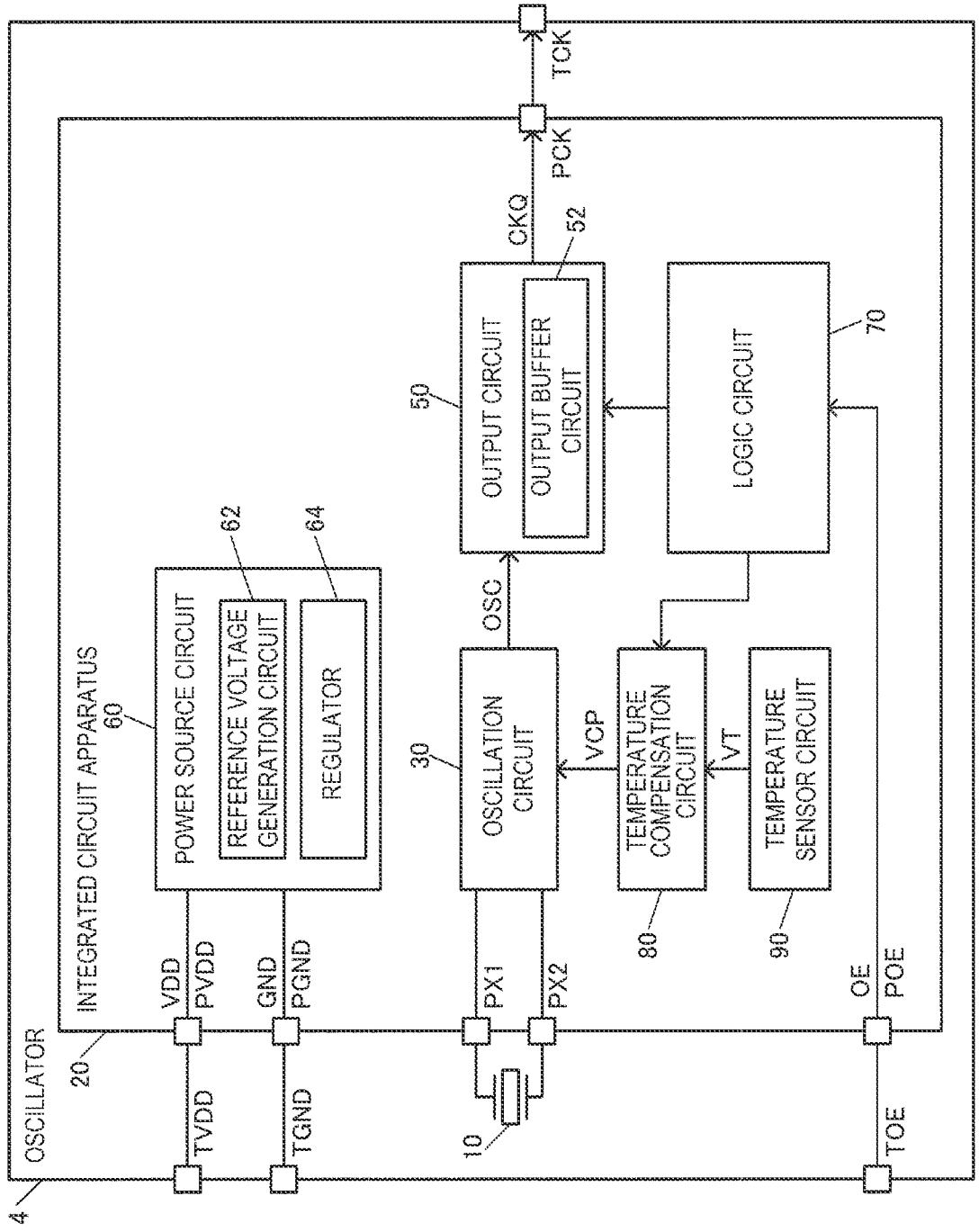
FIG. 17 shows an example of the configuration of the integrated circuit apparatus according to the embodiment.
Figure 19:
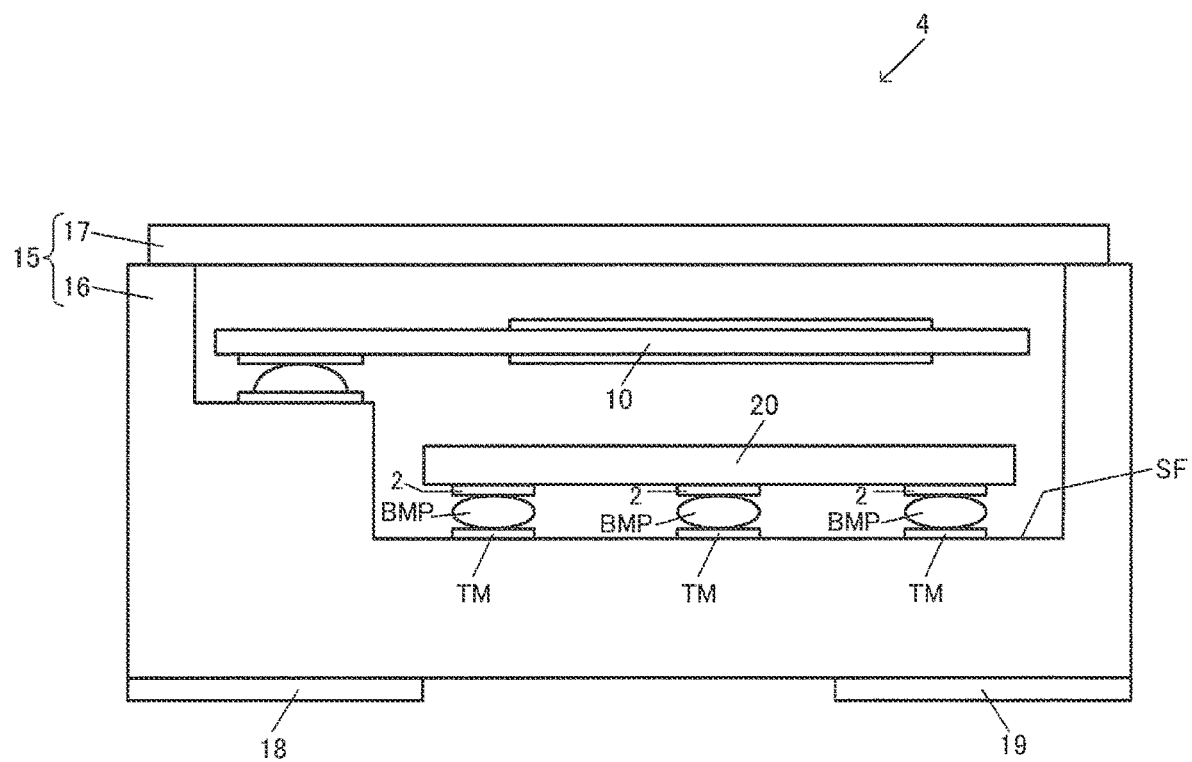
FIG. 19 shows an example of the structure of an oscillator according to the embodiment.

Furthermore, when the circuit 8, which overlaps with the pad 2 in the plan view, is the oscillation circuit 30, the pad 2 is electrically coupled to the resonator 10, as shown in FIGS. 17 and 19, which will be described later. For example, the pad 2 and the resonator are electrically coupled to each other, for example, via internal wiring, bumps, or bonding wires in a package 15 shown in FIG. 19. In the configuration described above, even when a force acts on the pad 2, for example, during mounting of the resonator 10, the protective wiring 5 absorbs the force to suppress transmission of the force to the oscillation circuit 30 below the pad 2. The configuration described above prevents the oscillation circuit 30 from being broken or defective due to the force.

Figure 15:
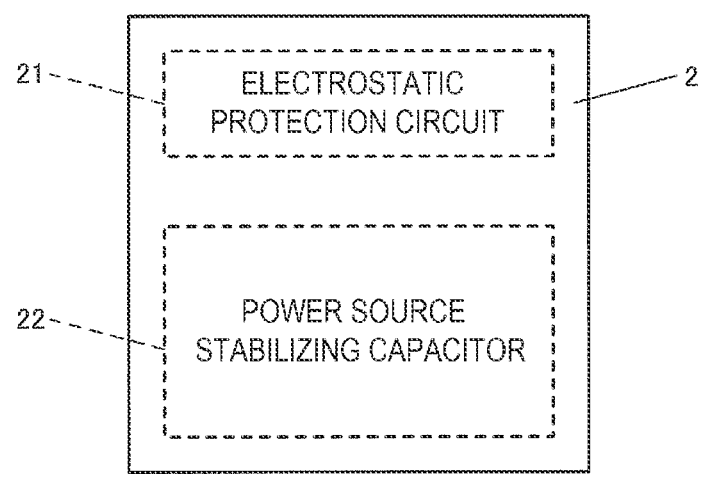
FIG. 15 shows an example of the circuit provided below the pad.

The circuit 8 disposed so as to overlap with the pad 2 may be an electrostatic protection circuit 21 or a power source stabilizing capacitor 22, as shown in FIG. 15. The electrostatic protection circuit 21 is an ESD (electrostatics discharge) protection circuit. The electrostatic protection circuit 21 is formed of an electrostatic protector that is an ESD protector. The electrostatic protector is, for example, a diode for static electricity protection or a resistor for static electricity protection. For example, when a surge voltage, such as static electricity, is applied to the pad 2, the electrostatic protection circuit 21 discharges the electric charge caused by the static electricity to the ground or the power source to protect a circuit or any other component coupled to the pad 2. The power source stabilizing capacitor 22 is, for example, a capacitor that is provided between the power source and the ground and suppresses power source fluctuations, for example, during operation of the integrated circuit apparatus 20. The power source stabilizing capacitor 22 is also called a bypass capacitor. The power source stabilizing capacitor 22 may, for example, be a capacitor made of polysilicon, or a capacitor using a diffusion layer. When the electrostatic protection circuit 21 or the power source stabilizing capacitor 22 is disposed so as to overlap with the pad 2 in the plan view as described above, the region of the pad 2 can be effectively used to dispose the electrostatic protection circuit 21 or the power source stabilizing capacitor 22, whereby the area of the integrated circuit apparatus 20 can be reduced. Furthermore, in the present embodiment, in which the protective wiring 5 is provided between the pad 2 and the electrostatic protection circuit 21 or the power source stabilizing capacitor 22, even when a force acts on the pad 2, for example, during mounting or inspection of the integrated circuit apparatus 20, the protective wiring 5 absorbs the force to suppress transmission of the force to the electrostatic protection circuit 21 or the power source stabilizing capacitor 22. The configuration described above prevents the electrostatic protection circuit 21 or the power source stabilizing capacitor 22 from being broken or defective due to the force.

Figure 16:
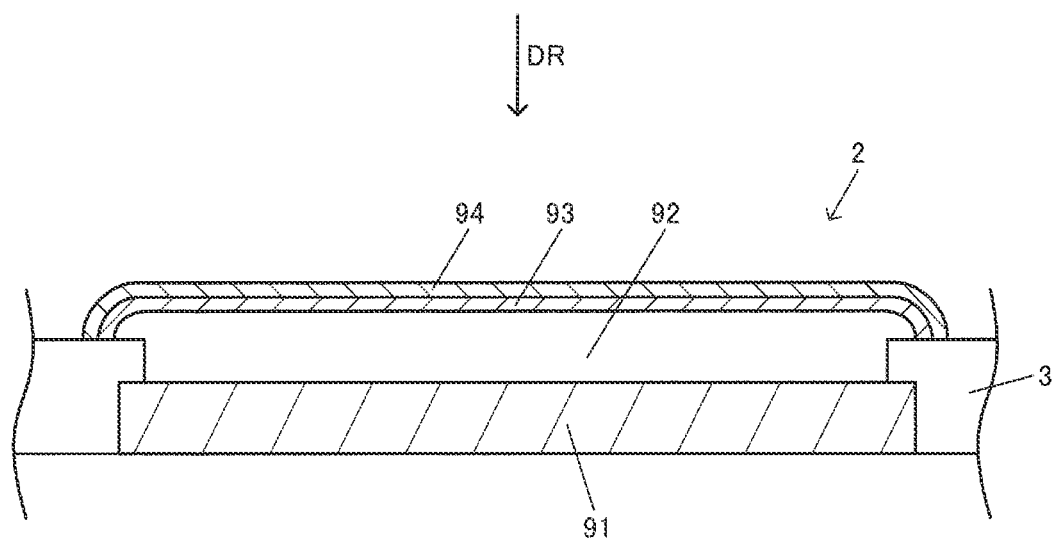
FIG. 16 shows an example of the structure of the pad.

Although FIGS. 1 and 2 diagrammatically show the structure of the pad 2, pads having a variety of structures can be employed as the pad 2. FIG. 16 is a cross-sectional view showing an example of the detailed structure of the pad 2. In FIG. 16, electrically conductive layers 92, 93, and 94 are formed on a pad metal 91, for example, by plating. The electrically conductive layer 92 is made of a material that satisfactorily joins to the pad metal 91, which is made of aluminum or aluminum alloy, and examples of the material include nickel and nickel alloy. The electrically conductive layer 92 has a thickness ranging, for example, from 2 to 10 µm. The electrically conductive layer 92 having such a large thickness is unlikely to transmit a large load applied when a bump or a bonding wire is joined to the pad 2 to the portion below the pad 2. The load applied when a bump or a bonding wire is joined to the pad 2 therefore does not cause a situation in which the circuit 8, which is provided below the pad 2, malfunctions. The electrically conductive layer 93 is interposed between the electrically conductive layers 92 and 94 to improve the adhesion between the electrically conductive layers 92 and 94 and also functions as a barrier layer that prevents the electrically conductive layer 92 from diffusing into the electrically conductive layer 94. The electrically conductive layer 93 is made of a material that satisfactorily adheres to both the electrically conductive layers 92 and 94, and examples of the material include palladium and palladium alloy. The electrically conductive layer 93 only needs to be provided as required and can be omitted, for example, when the electrically conductive layers 92 and 94 satisfactorily adhere to each other. The electrically conductive layer 94 functions as a coupling layer coupled to the bump or the bonding wire. The electrically conductive layer 94 is made of a material having low contact resistance to the bump or the bonding wire, and examples of the material include gold and gold alloy. Using the pad 2 having the structure shown in FIG. 16 allows the circuit 8 below the pad to be protected against the load applied during the mounting in which a bump or a bonding wire is joined to the pad 2 and further allows the bump or the bonding wire to be joined with low contact resistance, whereby the mounting can be readily performed, and improved reliability and other advantages are achieved.

2. Integrated Circuit Apparatus

A specific example of the integrated circuit apparatus 20 according to the present embodiment will next be described. FIG. 17 shows an example of the configuration of the integrated circuit apparatus 20 according to the present embodiment. The integrated circuit apparatus 20 does not necessarily have the configuration shown in FIG. 17, and a variety of variations are conceivable, for example, part of the components of the configuration shown in FIG. is omitted, or another component is added to the configuration. The following description will be made primarily of a case where a device in which the integrated circuit apparatus 20 according to the present embodiment is incorporated is an oscillator 4 by way of example, but the device in which the integrated circuit apparatus 20 according to the present embodiment is incorporated is not limited to the oscillator 4.

The integrated circuit apparatus 20 shown in FIG. 17 includes the oscillation circuit 30. The integrated circuit apparatus 20 can further include an output circuit 50, a power source circuit 60, a logic circuit 70, a temperature compensation circuit 80, a temperature sensor circuit 90, a power source pad PVDD, a ground pad PGND, a clock pad PCK, an output enable pad POE, and resonator coupling pads PX1 and PX2. The oscillator 4 includes the resonator 10 and the integrated circuit apparatus 20. The resonator 10 is electrically coupled to the integrated circuit apparatus 20. The resonator 10 and the integrated circuit apparatus 20 are electrically coupled to each other, for example, by using internal wiring, bonding wires, or metal bumps in a package that accommodates the resonator 10 and the integrated circuit apparatus 20.

The resonator 10 is an element that produces mechanical resonance in response to an electric signal. The resonator 10 can be achieved by a resonator element, for example, a quartz crystal resonator element. The resonator 10 can be achieved, for example, by a resonator that is cut at an AT or SC cut angle and undergoes thickness slide resonance, such as a quartz crystal resonator element, a tuning-fork-type quartz crystal resonator element, or a double tuning-fork-type quartz crystal resonator element. For example, the resonator 10 may be a resonator built in a temperature compensated quartz crystal oscillator (TCXO) including no thermostatic oven or a resonator built in an oven controlled quartz crystal oscillator (OCXO) including a thermostatic oven. The resonator 10 may instead be a resonator built in a simple packaged quartz crystal oscillator (SPXO). The resonator 10 in the present embodiment can also be achieved by any of a variety of other resonator elements, for example, a resonator element other than the thickness slide resonance type, the tuning fork type, or the double tuning fork type and a piezoelectric resonator element made of a material other than quartz crystal. For example, a SAW (surface acoustic wave) resonator or a MEMS (micro electro mechanical systems) resonator in the form of a silicon resonator formed by using a silicon substrate may be employed as the resonator 10.

The integrated circuit apparatus 20 is an IC (integrated circuit) manufactured, for example, in a semiconductor process and is a semiconductor chip in which circuit elements are formed on a semiconductor substrate.

The oscillation circuit 30 is a circuit that causes the resonator 10 to oscillate. For example, the oscillation circuit 30 is electrically coupled to the pads PX1 and PX2 and generates an oscillation signal OSC by causing the resonator 10 to oscillate. The pad PX1 is a first resonator coupling pad, and the pad PX2 is a second resonator coupling pad. For example, the oscillation circuit 30 can be achieved by a drive circuit, which is provided between the pads PX1 and PX2 and used to cause the resonator 10 to oscillate, and passive elements, such as capacitors and resistors. The drive circuit can be achieved, for example, by a CMOS inverter circuit or a bipolar transistor. The drive circuit is a core circuit of the oscillation circuit 30 and causes the resonator 10 to oscillate by driving the resonator 10 with voltage or current. The oscillation circuit 30 can be any of a variety of types of oscillation circuit, such as an inverter-type oscillation circuit, a Pierce-type oscillation circuit, a Colpitts-type oscillation circuit, and a Hartley-type oscillation circuit. The oscillation circuit 30 is provided with a variable capacitance circuit, and the oscillation frequency of the oscillation circuit 30 can be adjusted by adjusting the capacitance of the variable capacitance circuit. The variable capacitance circuit can be achieved, for example, by a variable capacitance element, such as a varactor. The variable capacitance circuit can be achieved, for example, by a variable capacitance element having capacitance controlled based on a temperature compensated voltage. The variable capacitance circuit may instead be achieved by a capacitor array and a switch array coupled to the capacitor array. It is noted that the coupling in the present embodiment is electrical coupling. The electrical coupling is coupling that allows transmission of an electric signal and hence transmission of information in the form of the electric signal. The electrical coupling may be coupling, for example, via a passive element.

The output circuit 50 outputs a clock signal CKQ based on an oscillation signal OSC. The output circuit 50 includes an output buffer circuit 52. For example, the output buffer circuit 52 buffers the oscillation signal OSC and outputs the buffered oscillation signal OSC as the clock signal CKQ to the clock pad PCK. The clock signal CKQ is then outputted out of the oscillator 4 via an external terminal TCK of the oscillator 4. For example, the output circuit 50 outputs the clock signal CKQ in the form of a single-ended CMOS signal. The output circuit 50 may output the clock signal CKQ in the form of a non-CMOS signal. The output circuit 50 may output, for example, differential clock signals in any of the following signal formats: LVDS (low voltage differential signaling); PECL (positive emitter coupled logic); HCSL (high speed current steering logic); and differential CMOS (complementary MOS), to a component outside the oscillator 4.

A power source voltage VDD via the power source pad PVDD and a ground voltage via the ground pad PGND are supplied to the power source circuit 60, which then supplies the internal circuits of the integrated circuit apparatus 20 with a variety of power source voltages for the internal circuits. For example, the power source circuit 60 supplies the oscillation circuit 30 and other components with regulated power source voltages based on the power source voltage VDD. The power source circuit 60 includes a reference voltage generation circuit 62 and a regulator 64. The reference voltage generation circuit 62 generates and outputs a reference voltage. The reference voltage generation circuit 62 can be achieved, for example, by a bandgap reference circuit, a circuit using a gate work function difference, or a circuit using a threshold voltage difference that occurs when a channel impurity concentration is changed. The power source voltage VDD is supplied to the regulator 64, which then generates a variety of regulated power source voltages. For example, the regulator 64 generates a constant regulated power source voltage that is a stepped-down power source voltage VDD based on the reference voltage generated by the reference voltage generation circuit 62 and supplies each circuit block of the integrated circuit apparatus 20 with the generated regulated power source voltage.

The logic circuit 70 is a control circuit and performs a variety of types of control. For example, the logic circuit 70 controls the entire integrated circuit apparatus 20 and controls the operational sequence of the integrated circuit apparatus 20. For example, the logic circuit 70 controls each circuit block of the integrated circuit apparatus 20, such as the oscillation circuit 30, the output circuit 50, the power source circuit 60, and the temperature compensation circuit 80. The logic circuit 70 can be achieved, for example, by an ASIC (application specific integrated circuit) produced by automatically placed wiring, such as a gate array.

The temperature compensation circuit 80 performs temperature compensation on the oscillation signal OSC from the oscillation circuit 30. The temperature compensation of the oscillation signal OSC is temperature compensation of the oscillation frequency of the oscillation circuit 30. Specifically, the temperature compensation circuit 80 performs the temperature compensation based on temperature detection information from the temperature sensor circuit 90. For example, the temperature compensation circuit 80 performs the temperature compensation on the oscillation signal OSC from the oscillation circuit 30 by generating a temperature compensated voltage VCP based on a temperature detection voltage VT from the temperature sensor circuit 90 and outputting the generated temperature compensated voltage VCP to the oscillation circuit 30. For example, the temperature compensation circuit 80 performs the temperature compensation by outputting the temperature compensated voltage VCP, which is the voltage that controls the capacitance of the variable capacitance circuit provided in the oscillation circuit 30, to the variable capacitance circuit. In this case, the variable capacitance circuit in the oscillation circuit 30 is achieved by a variable capacitance element, such as a varactor. The temperature compensation is the process of suppressing variation in the oscillation frequency caused by variation in the temperature to compensate for the variation in the oscillation frequency. For example, the temperature compensation circuit 80 performs analog temperature compensation using polynomial approximation. For example, when a temperature compensation voltage that compensates for variation in the frequency-temperature characteristics of the resonator 10 is approximately expressed by a polynomial, the temperature compensation circuit 80 performs analog temperature compensation based on information on the coefficients of the polynomial. The temperature compensation circuit 80 may perform digital temperature compensation.

The temperature sensor circuit 90 is a sensor circuit that detects the temperature. Specifically, the temperature sensor circuit 90 outputs a temperature dependent voltage that changes in accordance with the ambient temperature as the temperature detection voltage VT. For example, the temperature sensor circuit 90 uses a temperature-dependent circuit element to generate the temperature detection voltage VT. Specifically, the temperature sensor circuit 90 uses the temperature dependence of the forward voltage of a PN junction to output the temperature detection voltage VT, which changes depending on the temperature. The forward voltage of a PN junction can, for example, be the base-emitter voltage of a bipolar transistor. To perform the digital temperature compensation, the temperature sensor circuit 90 measures the temperature, such as the ambient temperature, and outputs the result of the measurement as the temperature detection data.

The integrated circuit apparatus 20 further includes the power source pad PVDD, the ground pad PGND, the clock pad PCK, the output enable pad POE, and the resonator coupling pads PX1 and PX2. The pads described above are, for example, terminals of the integrated circuit apparatus 20, which is a semiconductor chip.

The power source pad PVDD is a pad to which the power source voltage VDD is supplied. For example, the power source voltage VDD from an external electric power supply device is supplied to the power source pad PVDD. The ground pad PGND is a terminal to which GND, which is the ground voltage, is supplied. GND can also be called VSS, and the ground voltage is, for example, a ground potential. In the present embodiment, the ground is referred to as GND as appropriate. The clock pad PCK is a pad via which the clock signal CKQ is outputted. For example, the clock signal CKQ based on the oscillation signal OSC from the oscillation circuit 30 is outputted via the clock pad PCK out of the integrated circuit apparatus 20. The output enable pad POE is a pad for controlling whether the output of the clock signal CKQ is enabled. Specifically, whether the output of the clock signal CKQ is enabled is controlled based on an output enable signal OE, which is inputted via the output enable pad POE. For example, the logic circuit 70 receives the output enable signal OE via the output enable pad POE and controls whether the output circuit 50 enables the output of the clock signal CKQ.

The power source pad PVDD, the ground pad PGND, the clock pad PCK, and the output enable pad POE are electrically coupled to external terminals TVDD, TGND, TCK, and TOE of the oscillator 4, respectively, for external coupling. The electrical coupling is, for example, made by using the internal wiring, bonding wires, or metal bumps in the package. The external terminals TVDD, TGND, TCK, and TOE of the oscillator 4 are then electrically coupled to an external device. The pads PX1 and PX2 are pads to which the resonator 10 is coupled. For example, the pad PX1 is electrically coupled to one end of the resonator 10, and the pad PX2 is electrically coupled to the other end of the resonator 10. For example, the resonator 10 is electrically coupled to the pads PX1 and PX2 of the integrated circuit apparatus 20 by using the internal wiring, bonding wires, or metal bumps in the package that accommodates the resonator 10 and the integrated circuit apparatus 20.

The above description has been made of the case where the device in which the integrated circuit apparatus 20 according to the present embodiment is incorporated is the oscillator 4, and further made of an example of the configuration of the integrated circuit apparatus 20 incorporated in the oscillator 4, but the present embodiment is not necessarily configured as described above. For example, the device in which the integrated circuit apparatus 20 according to the present embodiment is incorporated may be a sensor device, such as a gyro sensor and an acceleration sensor, a display device that displays images on a display panel, a communication device that performs communication in accordance with a predetermined communication standard, a drive device that drives a predetermined mechanism of a printer, or a power source device that supplies electric power and controls a power source. The integrated circuit apparatus 20 according to the present embodiment is not necessarily incorporated in the oscillator 4 and can be an IC (integrated circuit) incorporated in the sensor device, the display device, the communication device, or the power source device described above. For example, when the device is a gyro sensor, the integrated circuit apparatus 20 can include a drive circuit that drives a resonator of the gyro sensor, a detection circuit that detects a sensor signal from the resonator, and other circuits. When the device is an acceleration sensor, the integrated circuit apparatus 20 can include a drive circuit and a detection circuit for an acceleration sensor element realized, for example, by MEMS (micro electro mechanical systems). When the device is a display device, the integrated circuit apparatus 20 can include a drive circuit that drives the display panel, a logic circuit that processes data to be displayed, and other circuits. When the device is a communication device, the integrated circuit apparatus 20 can include a physical layer circuit, a link layer circuit, and a logic circuit for communication. As described above, the integrated circuit apparatus 20 can employ circuits having a variety of configurations.

3. Layout

Figure 18:
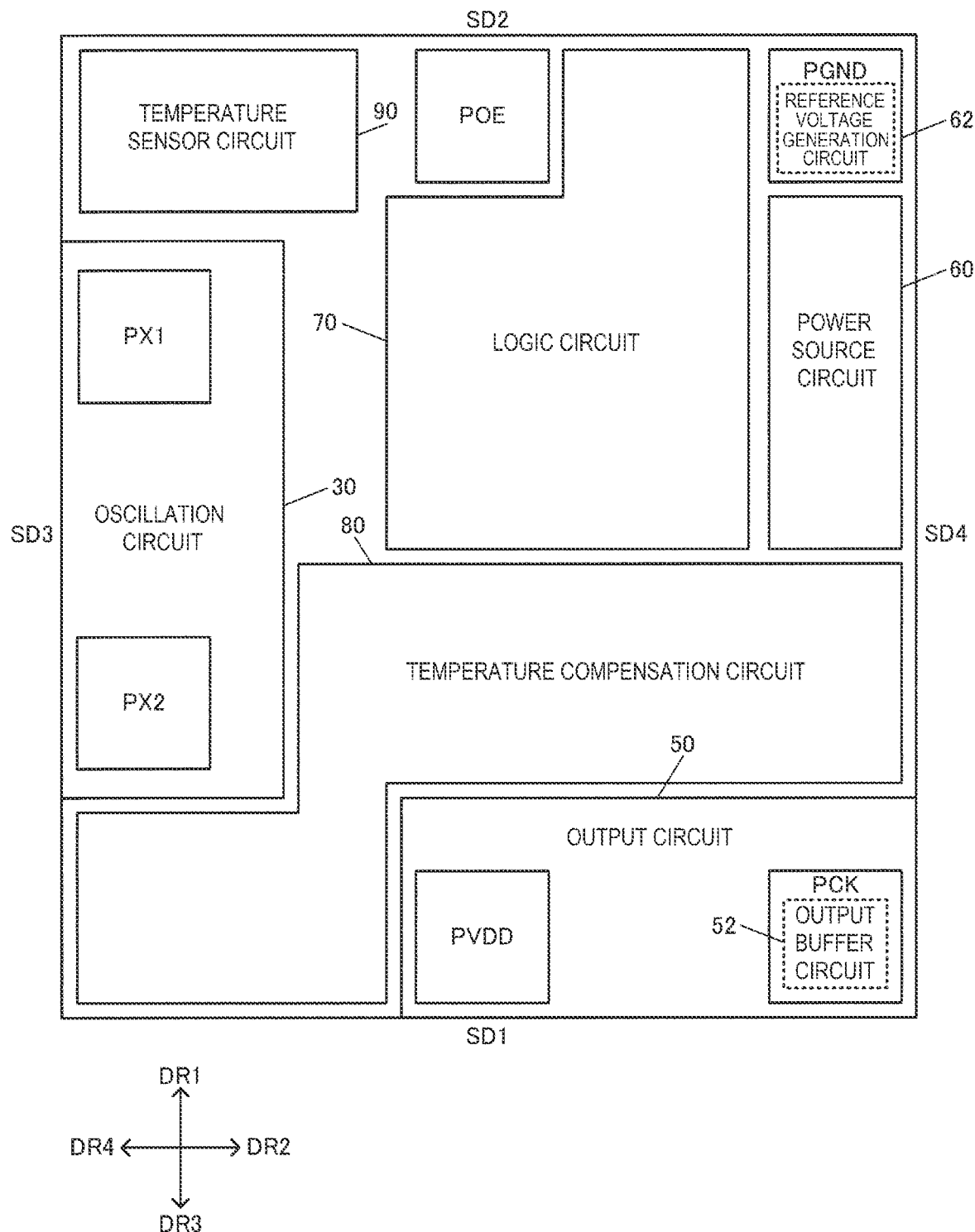
FIG. 18 shows an example of the layout of the integrated circuit apparatus.

FIG. 18 shows an example of the layout of the integrated circuit apparatus 20 shown in FIG. 17. The external shape of the integrated circuit apparatus 20 has an edge SD1 and an edge SD2 facing the edge SD1. The edge SD1 is a first edge, the edge SD2 is a second edge, and the edge SD2 is the edge facing the edge SD1. The external shape of the integrated circuit apparatus 20 further has edges SD3 and SD4, which intersect with the edges SD1 and SD2. The edge SD3 is a third edge, the edge SD4 is a fourth edge, and the edge SD4 is the edge facing the edge SD3. The external shape of the integrated circuit apparatus 20 is, for example, the external shape of a rectangular semiconductor chip that is the integrated circuit apparatus 20. For example, the edges SD1, SD2, SD3, and SD4 are the edges of the substrate of the semiconductor chip. The semiconductor chip is also called a silicon die. In the description, DR1 represents the direction from the edge SD1 toward the edge SD2, and DR2 represents the direction from the edge SD3 toward the edge SD4. Similarly, a direction DR3 is the direction opposite the direction DR1, and a direction DR4 is the direction opposite the direction DR2. The directions DR1, DR2, DR3, and DR4 are first, second, third, and fourth directions, respectively.

The integrated circuit apparatus 20 is provided with the ground pad PGND, the power source pad PVDD, the clock pad PCK, and the output enable pad POE, as shown in FIG. 18. The power source pad PVDD and the clock pad PCK are arranged along the edge SD1. The clock pad PCK is disposed, for example, at a first corner where the edges SD1 and SD4 intersect with each other. The output enable pad POE and the ground pad PGND are disposed along the edge SD2. The ground pad PGND is disposed, for example, at a second corner where the edges SD2 and SD4 intersect with each other. The temperature sensor circuit 90 is disposed at a third corner where the edges SD2 and SD3 intersect with each other. The temperature sensor circuit 90 may be disposed so as, for example, to overlap with the output enable pad POE in the plan view.

The integrated circuit apparatus 20 is further provided with the resonator coupling pads PX1 and PX2. The resonator coupling pads PX1 and PX2 are disposed along the edge SD3. For example, the oscillation circuit 30 is disposed along the edge SD3, and the resonator coupling pads PX1 and PX2 are disposed in the region of the oscillation circuit 30. The output circuit 50 is disposed along the edge SD1, and the power source circuit 60 is disposed along the edge SD4. The logic circuit 70 is disposed between the oscillation circuit 30 and the power source circuit 60. The temperature compensation circuit 80 is disposed between the oscillation circuit 30 and the output circuit 50, and the logic circuit 70 is disposed between the temperature compensation circuit 80 and the edge SD2.

In FIG. 18, the reference voltage generation circuit 62 is disposed so as to overlap with the ground pad PGND in the plan view. That is, the reference voltage generation circuit 62 is disposed below the ground pad PGND. A shielding effect provided by the ground pad PGND thus suppresses transmission of high-frequency noise to the reference voltage generation circuit 62, preventing potential fluctuations that lower the accuracy of the clock frequency from occurring in the reference voltage generated by the reference voltage generation circuit 62. Furthermore, the region where the ground pad PGND is disposed can be effectively used to dispose the reference voltage generation circuit 62, whereby the area of the integrated circuit apparatus 20 can be reduced. Out of the circuits that form the power source circuit 60, the circuits other than the reference voltage generation circuit 62 are disposed, for example, along the edge SD4 without overlapping with the ground pad PGND in the plan view.

In FIG. 18, the output buffer circuit 52 is disposed so as to overlap with the clock pad PCK in the plan view. That is, the output buffer circuit 52 is disposed below the clock pad PCK. Out of the circuits that form the output circuit 50, the circuits other than the output buffer circuit 52 are disposed, for example, along the edge SD1 without overlapping with the clock pad PCK in the plan view.

Arranging the clock pad PCK and the output buffer circuit 52 so as to overlap with each other in the plan view as described above allows the clock signal CKQ from the output buffer circuit 52 to be outputted to the clock pad PCK located immediately thereabove in a short, clock wiring path from the output buffer circuit 52 toward the clock pad PCK. The impedance of the clock wiring can therefore be minimized, whereby potential fluctuations caused by the impedance can be suppressed. The output buffer circuit 52, which needs to drive a large external load, has a high driving capability. Therefore, a high-impedance clock wiring has large potential fluctuations, so that the signal quality of the clock signal CKQ deteriorates. In this regard, arranging the clock pad PCK and the output buffer circuit 52 so as to overlap with each other in the plan view allows a short clock wiring path that couples the output buffer circuit 52 and the clock pad PCK to each other, whereby the impedance of the clock wiring can be minimized, so that the deterioration of the signal quality of the clock signal CKQ can be suppressed. Since the output buffer circuit 52 has a high driving capability to drive an external load and therefore produces a large amount of high-frequency noise, the output buffer circuit 52 and the clock pad PCK, via which the clock signal CKQ is outputted, form high-frequency noise sources. In this regard, arranging the clock pad PCK and the output buffer circuit 52 so as to overlap with each other in the plan view allows the high-frequency noise sources to be disposed collectively at one location. The layout that reduces the adverse effects of the noise from the high-frequency noise sources and other measures can thus be readily implemented.

The outer shape of the integrated circuit apparatus 20 has the edge SD1 and the edge SD2 facing the edge SD1, the output buffer circuit 52 and the clock pad PCK are disposed on the side facing the edge SD1, and the reference voltage generation circuit 62 and the ground pad PGND are disposed on the side facing the edge SD2, as shown in FIG. 18. The edge SD1 is the first edge, and the edge SD2 is the second edge. For example, the output buffer circuit 52 and the clock pad PCK are disposed at a location closer to the edge SD1 than to the edge SD2. The reference voltage generation circuit 62 and the ground pad PGND are disposed at a location closer to the edge SD2 than to the edge SD1. For example, the output buffer circuit 52 and the clock pad PCK are disposed in a first region from the center line between the edges SD1 and SD2 to the edge SD1, and the reference voltage generation circuit 62 and the ground pad PGND are disposed in a second region from the center line between edges SD1 and SD2 to the edge SD2. Therefore, the output buffer circuit 52 and the clock pad PCK, which are high-frequency noise sources, are disposed on the side facing the edge SD1, while the reference voltage generation circuit 62 and the ground pad PGND, which need to avoid high-frequency noise, are disposed on the side facing the edge SD2. The distance from the output buffer circuit 52 and the clock pad PCK, which are high-frequency noise sources, to the reference voltage generation circuit 62 and the ground pad PGND can thus be increased. The transmission of the high-frequency noise from the output buffer circuit 52 and the clock pad PCK to the reference voltage generation circuit 62 and the ground pad PGND can therefore be suppressed, whereby deterioration of the accuracy of the clock frequency caused by high-frequency noise can be avoided.

The outer shape of the integrated circuit apparatus 20 has the edge SD3, which is the third edge and intersects with the edges SD1 and SD2, and the oscillation circuit 30 is provided on the side facing the edge SD3. The oscillation circuit 30 is provided, for example, along the edge SD3. Specifically, the oscillation circuit 30 is so disposed that, for example, the longitudinal edges thereof extend along the edge SD3. Arranging the oscillation circuit 30 on the side facing the edge SD3 as described above allows an increase in the distance from the output buffer circuit 52 and other components disposed on the side facing the edge SD1 to the oscillation circuit 30, whereby the situation in which the high-frequency noise from the output buffer circuit 52 is superimposed on the oscillation signal OSC so that the oscillation characteristics deteriorate can be avoided. Furthermore, arranging the oscillation circuit 30 on the side facing the edge SD3 allows an increase in the distance from the reference voltage generation circuit 62 and other components disposed on the side facing the edge SD2 to the oscillation circuit 30, whereby the situation in which oscillation noise from the oscillation circuit 30 is superimposed on the reference voltage from the reference voltage generation circuit 62 and other voltages so that the accuracy of the clock frequency decreases and other disadvantageous situations can be avoided.

The integrated circuit apparatus 20 further includes the temperature compensation circuit 80, which performs temperature compensation on the oscillation frequency of the oscillation signal OSC. The temperature compensation circuit 80 is provided between the oscillation circuit 30 and the clock pad PCK, as shown in FIG. 18. For example, the temperature compensation circuit 80 is provided in a position shifted from the oscillation circuit 30 in the direction DR2, and the clock pad PCK is provided in a position shifted from the temperature compensation circuit 80 in the direction DR2. Providing the temperature compensation circuit 80 between the oscillation circuit 30 and the clock pad PCK as described above allows the region between the oscillation circuit 30 and the clock pad PCK to be effectively used to dispose the temperature compensation circuit 80, whereby the temperature compensation circuit 80 can be efficiently laid out. Furthermore, the distance between the clock pad PCK, which is a noise source, and the oscillation circuit 30 can be increased, whereby transmission of the noise from the clock pad PCK to the oscillation circuit 30 can be suppressed. Moreover, the temperature compensation circuit 80 can be disposed in the vicinity of the oscillation circuit 30, whereby the temperature compensation voltage VCP from the temperature compensation circuit 80 can be inputted to the oscillation circuit 30 along a short signal path to achieve the temperature compensation of the oscillation frequency.

In the present embodiment, the oscillation circuit 30 is disposed below the resonator coupling pads PX1 and PX2 in FIG. 18. That is, the oscillation circuit 30 is disposed, as the circuit 8 in FIG. 1 and other figures, so as to overlap with the pads PX1 and PX2, and the protective wiring 5, which has one end to which the resistor 7 coupled to the electric charge discharging path 6 is coupled, is provided between the pads PX1, PX2 and the oscillation circuit 30. The configuration described above, in which the region of the pads PX1 and PX2 can be effectively used to dispose part of the drive circuit, the variable capacitance circuit, or any other circuit of the oscillation circuit 30, allows reduction in the area of the integrated circuit apparatus 20. Furthermore, even when a force acts on the pads, for example, during mounting or inspection of the integrated circuit apparatus 20, the protective wiring 5 absorbs the force to suppress transmission of the force to the oscillation circuit 30. Moreover, the configuration in which one end of the protective wiring 5 is electrically coupled to the electric charge discharging path 6 via the resistor 7 prevents deterioration of the signal characteristics of the oscillation signal OSC, which is the AC signal from the oscillation circuit 30, and resultant deterioration of the oscillation characteristics of the integrated circuit apparatus 20.

Furthermore, in the present embodiment, the output buffer circuit 52, which buffers the clock signal CKQ, is disposed below the clock pad PCK in FIG. 18. That is, the output buffer circuit 52 is disposed, as the circuit 8 in FIG. 1 and other figures, so as to overlap with the clock pad PCK, and the protective wiring 5, which has one end to which the resistor 7 coupled to the electric charge discharging path 6 is coupled, is provided between the clock pads PCK and the output buffer circuit 52. The configuration described above, in which the region of the clock pad PCK can be effectively used to dispose the output buffer circuit 52, allows reduction in the area of the integrated circuit apparatus 20. Furthermore, even when a force acts on the pads, for example, during mounting or inspection of the integrated circuit apparatus 20, the protective wiring 5 absorbs the force to suppress transmission of the force to the output buffer circuit 52. Moreover, the configuration in which one end of the protective wiring 5 is electrically coupled to the electric charge discharging path 6 via the resistor 7 prevents deterioration of the signal characteristics of the clock signal CKQ, which is the AC signal outputted from the output buffer circuit 52, and resultant deterioration of the clock output characteristics of the integrated circuit apparatus 20.

4. Oscillator

FIG. 19 shows an example of the structure of the oscillator 4 according to the present embodiment. The oscillator 4 includes the resonator 10, the integrated circuit apparatus 20, and the package 15, which accommodates the resonator 10 and the integrated circuit apparatus 20. The package 15 is made, for example, of a ceramic material and has an accommodation space therein, and the resonator 10 and the integrated circuit apparatus 20 are accommodated in the accommodation space. The accommodation space is hermetically sealed and desirably under reduced pressure that is close to a vacuum. The package 15 can preferably protect the resonator 10 and the integrated circuit apparatus 20, for example, from shock, dust, heat, and moisture.

The package 15 includes a base 16 and a lid 17. Specifically, the package 15 is formed of the base 16, which supports the resonator 10 and the integrated circuit apparatus 20, and the lid 17, which is joined to the upper surface of the base 16 to form the accommodation space between the lid 17 and the base 16. The resonator 10 is supported via terminal electrodes by a stepped portion provided as an inner portion of the base 16. The integrated circuit apparatus 20 is disposed at a surface SF, which is the inner bottom surface of the base 16. Specifically, the integrated circuit apparatus 20 is so disposed that an active surface thereof faces the inner bottom surface of the base 16. The active surface is the surface where the circuit elements of the integrated circuit apparatus 20 are formed. Bumps BMP are formed at the pads 2, which are the terminals of the integrated circuit apparatus 20. The integrated circuit apparatus 20 is supported by the surface SF of the base 16 via the electrically conductive bumps BMP. The electrically conductive bumps BMP are each a metal bump, such as a gold bump. One end of each of the bumps BMP is coupled to the corresponding pad 2 of the integrated circuit apparatus 20, and the other end of the bump is coupled to a terminal TM provided at the surface SF, which is a mounting surface of the integrated circuit apparatus 20. The pads 2 of the integrated circuit apparatus 20 are thus electrically coupled to external terminals 18 and 19, which are external coupling terminals of the oscillator 4, and the resonator 10 via the bumps BMP, the terminals TM, and the internal wiring. The external terminals 18 and 19 are formed at the outer bottom surface of the package 15. The external terminals 18 and 19 are coupled to an external device via external wiring. The external wiring is, for example, wiring formed in a circuit substrate on which the external device is mounted. The integrated circuit apparatus 20 can thus output the clock signal and other signals to the external device.

In FIG. 19, the integrated circuit apparatus 20 is flip-mounted so that the active surface thereof faces downward, but the present embodiment does not necessarily employ mounting of this type. For example, the integrated circuit apparatus 20 may be so mounted that the active surface thereof faces upward. That is, the integrated circuit apparatus 20 is so mounted that the active surface thereof faces the resonator 10.

As described above, the integrated circuit apparatus according to the present embodiment includes a pad via which an AC signal is inputted or outputted, a circuit that overlaps with the pad in the plan view, protective wiring provided between the pad and the circuit, and a resistor having one end electrically coupled to the protective wiring and another end electrically coupled to an electric charge discharging path.

In the present embodiment, the protective wiring provided between the pad and the circuit is electrically coupled to one end of the resistor, and the other end of the resistor is electrically coupled to the electric charge discharging path. Therefore, the capacitance of the pad can be reduced, and the electric charge charged in the protective wiring can be discharged via the resistor and the electric charge discharging path. The thus provided integrated circuit apparatus not only allows the protective wiring to protect the circuit, which overlaps with the pad in the plan view, but can suppress deterioration of the characteristics of the integrated circuit apparatus and other disadvantages caused by the protective wiring.

In the present embodiment, the electric charge discharging path may be ground wiring or power source wiring.

In the configuration described above, the electric charge in the protective wiring can be discharged to the electric charge discharging path formed of the low-impedance ground wiring or power source wiring.

In the present embodiment, the electric charge discharging path may be a path coupled to the pad.

In the configuration described above, the electric charge in the protective wiring can be discharged to a device, wiring, or any other component electrically coupled to the pad.

In the present embodiment, the electric charge discharging path may be output wiring from a voltage generation circuit.

In the configuration described above, the electric charge in the protective wiring can be discharged to the low-impedance output wiring.

In the present embodiment, the integrated circuit apparatus may be electrically coupled to a resonator, and the circuit may be an oscillation circuit that causes the resonator to oscillate.

In the configuration described above, the region of the pad can be effectively used to dispose the oscillation circuit, whereby the area of the integrated circuit apparatus can be reduced. Furthermore, even when a force acts on the pad, for example, during mounting or inspection of the integrated circuit apparatus, the protective wiring absorbs the force to suppress transmission of the force to the oscillation circuit and suppress, for example, deterioration of the signal characteristics of the oscillation signal, which is an AC signal, from the oscillation circuit.

In the present embodiment, the pad may be electrically coupled to the resonator.

In the configuration described above, even when a force acts on the pad, for example, during mounting of the resonator, the protective wiring can absorb the force to suppress transmission of the force to the oscillation circuit.

In the present embodiment, the circuit may be an electrostatic protection circuit or a power source stabilizing capacitor.

In the configuration described above, even when a force acts on the pad, for example, during mounting or inspection of the integrated circuit apparatus, the protective wiring can absorb the force to suppress transmission of the force to the electrostatic protection circuit or the power source stabilizing capacitor.

In the present embodiment, $1/\{(1/C1)+(1/C2)\} \le C \le 1/\{(1/C1)+(1/2C2)\}$ may be satisfied, where C1 represents the capacitance between the pad and the protective wiring, and C2 represents the capacitance between the protective wiring and a substrate.

In the configuration described above, the capacitance of the pad can be reduced, and deterioration of the signal characteristics of the AC signal and other disadvantages due to the capacitance can be suppressed.

In the present embodiment, the area of the protective wiring in the plan view may be smaller than the area of the pad.

Reducing the area of the protective wiring as described above allows reduction in the capacitance of the pad and suppression of deterioration of the signal characteristics of the AC signal and other disadvantages due to the capacitance of the pad.

In the present embodiment, the protective wiring may be lattice-shape wiring or fence-shaped wiring.

Employing lattice-shape wiring or fence-shaped wiring as the protective wiring to reduce the area of the protective wiring as described above allows reduction in the capacitance of the pad and suppression of deterioration of the signal characteristics of the AC signal and other disadvantages due to the capacitance of the pad.

The present embodiment also relates to an oscillator including the integrated circuit apparatus described above and the resonator.

The present embodiment has been described above in detail, and a person skilled in the art will readily appreciate that a large number of variations are conceivable to the extent that they do not substantially depart from the novel items and effects of the present disclosure. Such variations are all therefore intended to fall within the scope of the present disclosure. For example, a term described at least once in the specification or the drawings along with a different term having a broader meaning or the same meaning can be replaced with the different term anywhere in the specification or the drawings. Furthermore, all combinations of the present embodiment and the variations fall within the scope of the present disclosure. Moreover, the configuration, operation, and other factors of each of the integrated circuit apparatus and the oscillator are not limited to those described in the present embodiment and can be changed in a variety of manners.

What is claimed is:

1. An integrated circuit apparatus comprising:
a pad via which an AC signal is inputted or outputted, the pad being configured to be joined to a bump or a bonding wire;
a circuit that overlaps with the pad in a plan view;
a protective wiring provided between the pad and the circuit; and
a resistor having one end electrically coupled to the protective wiring and another end electrically coupled to an electric charge discharging path,
wherein the protective wiring is directly and electrically connected to only the one end of the resistor.

2. The integrated circuit apparatus according to claim 1, wherein the electric charge discharging path is ground wiring or power source wiring.

3. The integrated circuit apparatus according to claim 1, wherein the electric charge discharging path is a path coupled to the pad.

4. The integrated circuit apparatus according to claim 1, wherein the electric charge discharging path is output wiring from a voltage generation circuit.

5. The integrated circuit apparatus according to claim 1, wherein the integrated circuit apparatus is electrically coupled to a resonator, and
the circuit is an oscillation circuit that causes the resonator to oscillate.

6. The integrated circuit apparatus according to claim 5, wherein the pad is electrically coupled to the resonator.

7. The integrated circuit apparatus according to claim 1, wherein the circuit is an electrostatic protection circuit or a power source stabilizing capacitor.

8. The integrated circuit apparatus according to claim 1, wherein $1/\{(1/C1)+(1/C2)\} \le C \le 1/\{(1/C1)+(1/2\ C2)\}$ is satisfied, where C1 represents capacitance between the pad and the protective wiring, and C2 represents capacitance between the protective wiring and a substrate.

9. The integrated circuit apparatus according to claim 1, wherein an area of the protective wiring in the plan view is smaller than an area of the pad.

10. The integrated circuit apparatus according to claim 1, wherein the protective wiring is lattice-shape wiring or fence-shaped wiring.

11. An oscillator comprising:
the integrated circuit apparatus according to claim 5; and
the resonator.

12. The integrated circuit apparatus according to claim 1, wherein the protective wiring has at least one hole.

13. The integrated circuit apparatus according to claim 1, wherein the electric charge discharging path overlaps with the pad in the plan view, and
the electric charge discharging path is disposed in a region where the protective wiring is not disposed in the plan view.

14. The integrated circuit apparatus according to claim 1, wherein the protective wiring is not directly coupled to a ground or a power source, and
the protective wiring is not electrically coupled to the circuit.

15. The integrated circuit apparatus according to claim 1, wherein the resistor is disposed at a same layer at which the circuit is disposed.

16. The integrated circuit apparatus according to claim 1, wherein a region of the protective wiring overlaps an entirety of a region where the circuit overlaps the pad in the plan view.

17. An integrated circuit apparatus comprising:
a pad via which an AC signal is inputted or outputted, the pad being configured to be joined to a bump or a bonding wire;
a circuit that overlaps with the pad in a plan view;
a protective wiring provided between the pad and the circuit; and
a resistor having one end electrically coupled to the protective wiring and another end electrically coupled to an electric charge discharging path,
wherein a first distance, between two opposite edges of the protective wiring, on a linear line extending along a first direction is larger than a second distance, between two opposite edges of the pad, on the linear line in the plan view.

* * * * *